(12) United States Patent
Huang et al.

(10) Patent No.: US 7,470,551 B2
(45) Date of Patent: Dec. 30, 2008

(54) SPIN TRANSISTOR AND MANUFACTURING METHOD THEREOF

(75) Inventors: Ying-Wen Huang, Hsinchu (TW); Chi-Kuen Lo, Hsinchu (TW); Lan-Chin Hsieh, Hsinchu (TW); Der-Ray Huang, Hsinchu (TW); Yeong-Der Yao, Hsinchu (TW); Jau-Jiu Ju, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/409,212

(22) Filed: Apr. 24, 2006

(65) Prior Publication Data
US 2007/0166841 A1 Jul. 19, 2007

(30) Foreign Application Priority Data
Dec. 30, 2005 (TW) .............................. 94147557 A (51) Int. Cl.
*H01L 21/00* (2006.01)
(52) U.S. Cl. ..................... 438/3; 438/238; 438/240; 257/E21.665
(58) Field of Classification Search ............... 438/3, 438/238, 381, 240; 257/E21.665
See application file for complete search history.

(56) References Cited
U.S. PATENT DOCUMENTS
6,226,197 B1 * 5/2001 Nishimura .................. 365/171
2001/0035545 A1 * 11/2001 Schuster-Woldan et al. . 257/296
2006/0220084 A1 * 10/2006 Umehara et al. ............ 257/296

OTHER PUBLICATIONS

Sato et al., Spin-valve transistor with an Fe/Au/Fe(001) base, Aug. 20, 2001, Applied Physics Letters, p. 1157-1159.
Erve et al., Transfer ratio of the spin-valve transistor; May 20, 2002, Applied Physics Letters, p. 3787-3789.
Dijken et al., Giant magnetocurrent exceeding 3400% in magnetic tunnel transistors with spin-valve base layers, Aug. 4, 2003, Applied Physics Letters, p. 514-953.
Dijken et al., The influence of nonmagnetic seed layers on the magnetotransport properties of magnetic tunnel transistors with a silicon collector, 2005, Journal of Applied Physics 97, p.043712-1~8.

* cited by examiner

*Primary Examiner*—H. Jey Tsai
(74) *Attorney, Agent, or Firm*—Rabin & Berdo, P.C.

(57) ABSTRACT

A spin transistor and a manufacturing method thereof are provided. The method includes defining a required area on a substrate by lithography; forming a doping area by ion-implantation, and forming a magnetoresistive film on the substrate. Finally, the method produces a spin transistor with the emitter, the base, and the collector in the same plane surface. The manufacturing method integrates the emitter, the base, and the collector into one plane, so that miniaturization of the spin transistor is achieved, and it is advantageous for the integration and subsequent packaging of the spin transistor and integrated circuit elements.

16 Claims, 8 Drawing Sheets

SPIN TRANSISTOR AND MANUFACTURING METHOD THEREOF

CROSS-REFERENCE TO RELATED APPLICATIONS

This non-provisional application claims priority under 35 U.S.C. § 119(a) on Patent Application Nos. 094147557 filed in Taiwan, R.O.C. on Dec. 30, 2005, the entire contents of which are hereby incorporated by reference.

BACKGROUND OF THE INVENTION

1. Field of Invention

The present invention relates to a spin transistor and a manufacturing method thereof, and more particularly, to a spin transistor of miniature structure and a manufacturing method thereof.

2. Related Art

The conventional transistor is a semiconductor element utilizing the transmitting effect of two carrier-electrons and holes, and is the core element of modern microelectronic circuitry. Digital circuits and analog circuits with various different functions are all assembled with transistors. A spin transistor controls electric signals of elements by making use of the spin upward and spin downward properties of electrons to generate an effect similar to that of a conventional transistor. A spin transistor as currently developed mainly interposes a layer of magnetoresistive element, used as an electron spin valve, between two potential energy barriers, and utilizes different configurations of magnetic arrangement of ferromagnetic layers in the magnetoresistive element to control the flow of thermal electrons.

A structure of the spin transistor as proposed by Monsma et al. in 1995 uses two semiconductor silicon substrates to sandwich a layer of magnetic multi-layer film, which is made by a vacuum bounding technique. This magnetic multi-layer film is formed of metal layers of Co, Cu, Co, Pt, etc., and is used as an electron spin valve and defined as a base. The silicon substrate bounding with Pt is used as an emitter, forming a Schottky barrier between Pt and the silicon substrate; the silicon substrate bounding with Co is used as a collector, forming another Schottky barrier between Co and the silicon substrate. Electrically, the Schottky barrier of the emitter is of negative bias, and the Schottky barrier of the collector is of positive bias, thus the emitter can accelerate electrons to pass through the Schottky barrier, enter the magnetic multi-layer film (the base), and become thermal electrons. The amount of thermal electrons passing through the base depends on whether the magnetic directions of two Co layers in the spin valve are the same. If the magnetic directions are opposite, the amount of thermal electrons passing through the base is small. If the magnetic directions are parallel, the amount of thermal electrons passing through the base is large. However, it is not easy to achieve miniaturization in production by the vacuum bounding technique and the cost is high.

Another spin transistor structure with two potential energy barriers is proposed by Mizushima et al. in 1997, wherein a magnetoresistive element is made as the base on an n-type GaAs substrate as the collector. One potential energy barrier is formed between the base and the aluminum oxide formed by oxidation of aluminum. The aluminum oxide is plated with metal as the emitter, which provides a Schottky barrier as another potential energy barrier. However, the pattern of this element is defined by a contact mask, thus it also is not easy to miniaturize.

Concerning the manufacturing method of patterns, contact mask lithography involves placing a contact mask with patterns directly on a substrate. The contact mask is used to directly block the portions not required when plating the film. Yellow light lithography is the most commonly used pattern transfer technique in semiconductor processing and microelectromechanical processing, and the basic principle thereof is to: transfer the patterns on a mask onto the photosensitive layer (i.e. photoresist) on the chip surface in the way of UV light exposure, then remove the places not required by a special etching solution (developer), thus a photoresist structure with desired patterns is obtained on the chip surface. R. Sato et al. in 2001 and Sebastiaan van Dijken et al. in 2003 and 2005 all suggested that, with the method of defining patterns by a contact mask, the minimum line width of a pattern is 100 micron. In addition, O. M. J. van't Erve et al. in 2002 suggested that, with the method of defining patterns by yellow light lithography, the minimum line width of a pattern is 350 micron. In summary, no matter which process is used, the size of an element is bigger than 100 micron, which hampers the popularization and application of spin transistors. Therefore, reducing the element size and simplifying the manufacturing process of spin transistors is indeed an important problem.

Electron beam lithography is one of the most important techniques for producing a structure of sub-micrometer to nanometer scale, the basic principle thereof being to directly write a special photoresist by electrons. The electrons are accelerated by high voltage and the traveling paths of the electrons are controlled by electromagnetic coils, thus various periodic and non-periodic patterns can be produced. Since the wavelength of electrons is smaller than that of the light source used by general photolithography, a higher resolution is provided. The electron beam lithography may easily achieve a line width with the size of hundreds of nanometers to several nanometers. It not only may be used to produce the mask required by photolithography, but also perform the direct write, that is, patterns are defined without a mask. Currently, the electron beam lithography has not yet been applied for defining patterns for the emitters, collectors, and bases of spin transistors.

To summarize the aforementioned content, a spin transistor as currently developed mainly interposes a layer of magetoresistive element between two potential energy barriers. The manufacturing process is complicated, and it is difficult to miniaturize the spin transistor due to the limitation of the lithography processes.

SUMMARY OF THE INVENTION

In view of the problems existing in prior art, the present invention provides a spin transistor and a manufacturing method thereof. The method includes defining a required area by lithography, determining doping concentration by ion-implantation; thereby a spin transistor with the emitter, the base, and the collector in the same plane surface is produced. Thus a miniature spin transistor is achieved, and it is advantageous for the integration and subsequent packaging of the spin transistor and integrated circuit elements.

The steps of a method for manufacturing the spin transistor disclosed in the present invention are that: first, forming an insulation layer on a substrate; forming a first contact window in the insulation layer; forming a doping area in the substrate via the first contact window, wherein the conductivity of the doping area is opposite to that of the substrate; then, forming a second contact window in the insulation layer and forming a magnetoresistive film on the insulation layer; finally, forming a first metal region at the first contact window, a second metal region at the second contact window, and a third metal region at the magnetoresistive film, wherein the first metal region contacts the magnetoresistive film. The first metal region, the second metal region and the third metal region are used as the base terminal, the collector terminal, and the emitter terminal of the spin transistor, respectively. Additionally, in the manufacturing method of the present invention, the second metal region may contact the magnetoresistive film, while the first metal region does not contact the magnetoresistive film. Here, the second metal region becomes the base terminal, and the first metal region becomes the collector terminal. Defining the area of the base terminal by lithography, and determining the concentration of the doping area of the base by ion-implantation, thereby a potential energy barrier between the base and the collector of the spin transistor is defined. The formed spin transistor mentioned above is a Current In Plane (CIP for short) type spin transistor.

In addition, the manufacturing method of the present invention may also produce a Current Perpendicular Plane (CPP for short) type spin transistor, the steps of which comprise: first, forming an insulation layer on a substrate; forming a first contact window in the insulation layer; forming a doping area in the substrate via the first contact window, wherein the conductivity of the doping area is opposite to that of the substrate; then, forming a second contact window in the insulation layer, and forming a magnetoresistive film at a first position of the first contact window; finally, forming a first metal region, a second metal region and a third metal region, wherein the first metal region is located on the magnetoresistive film, the second metal region is located at the second contact window, and the third metal region is located at a second position of the first contact window. The first metal region, the second metal region and the third metal region are used as the emitter, the collector, and the base of the spin transistor, respectively. Moreover, in the method of manufacturing a CPP type spin transistor, the magnetoresistive film is formed at the first position of the second contact window instead of at the first contact window. Here, the first metal region is formed at the first contact window, the second metal region is located on the magnetoresistive film, and the third metal region is located at the second position of the second contact window. Thus, the first metal region, the second metal region, and the third metal region are used as the collector, the emitter, and the base of the spin transistor, respectively.

Furthermore, the structure of the CIP type spin transistor produced by the present invention comprises a substrate having an insulation layer on its surface, in which the insulation layer has a first contact window and a second contact window; a doping area, formed in the substrate and located below the first contact window, wherein the conductivity of the doping area is opposite to that of the substrate; a first metal region, located at the first contact window; a second metal region, located at the second contact window; a magnetoresistive film, located on the insulation layer and contacts the first metal region; and a third metal region, located on the magnetoresistive film. Moreover, another structure of the CIP type spin transistor is that the magnetoresistive film contacts the second metal region instead of the first metal region. Other structures are the same as those of the aforementioned CIP type spin transistor.

In addition, the structure of the CPP type spin transistor produced according to the present invention comprises a substrate, having an insulation layer on its surface, in which the insulation layer has a first contact window and a second contact window; a doping area, formed in the substrate and located below the first contact window, wherein the conductivity of the doping area is opposite to that of the substrate; a magnetoresistive film, located at a first position of the first contact window; a first metal region, located on the magnetoresistive film; a second metal region, located at the second contact window; and a third metal region, located at a second position of the first contact window. Moreover, another structure of the CPP type spin transistor is that the magnetoresistive film is located at the first position of the second contact window. Here, the first metal region is located at the first contact window, the second metal region is located on the magnetoresistive film, and the third metal region is located at the second position of the second contact window. Other structures are the same as those of the aforementioned CPP type spin transistor.

The method of manufacturing the present invention produces a spin transistor with the emitter, the base, and the collector in the same plane surface. The process for manufacturing the spin transistor may be simplified, and it is advantageous for the integration and subsequent packaging of the spin transistor and integrated circuit elements. Also, miniaturization may be achieved by defining element patterns with electron beam lithography or yellow light lithography.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

To facilitate further understanding of the object, construction, features, and functions of the present invention, detailed illustration is made as follows in combination with embodiments. The above illustration related to the content of the present invention and the following illustration of embodiments are used to demonstrate and explain the principles of the present invention, and provide further explanation of the claims of the present invention.

Figure 1:
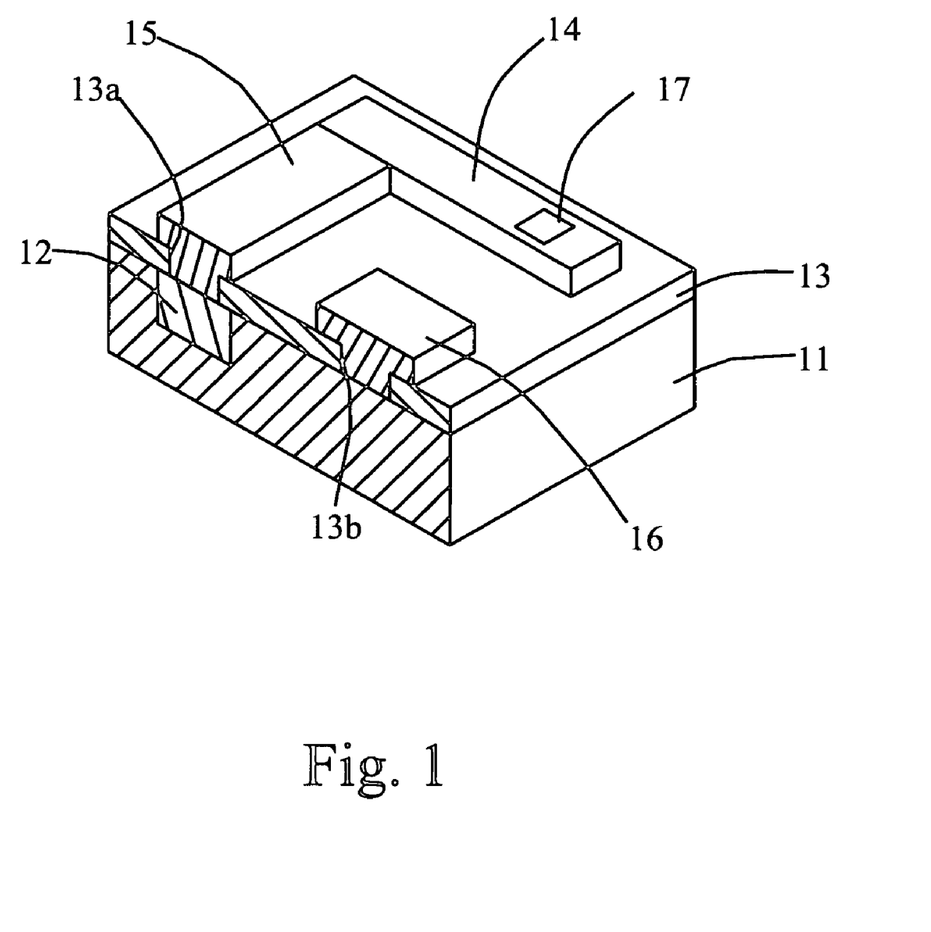
FIG. 1 is a schematic structural view of a first embodiment of the present invention.

Referring to FIG. 1, it is a schematic structural view of a CIP type spin transistor according to a first embodiment of the present invention. A P-type silicon substrate 11 has an insulation layer 13 on its surface, and the insulation layer 13 has a first contact window 13a and a second contact window 13b. An N-type well region 12 is formed in the P-type silicon substrate 11 by ion-implantation and is located below the first contact window 13a. A first metal region 15 is located at the first contact window 13a. A second metal region 16 is located at the second contact window 13b. A magnetoresistive film 14 is located on the insulation layer 13, and contacts the first metal region 15. A third metal region 17 is located on the magnetoresistive film 14. The first metal region 15, the second metal region 16, and the third metal region 17 are used as the base terminal, the collector terminal, and the emitter terminal of the spin transistor, respectively. The emitter may provide different resistance in different applied magnetic fields. The collector is used as a passive element to provide a single potential energy barrier (PN junction). The base is spaced between the emitter and the collector, and is electrically connected to the emitter and the collector respectively. The magnetoresistive film 14 may generate a high resistance or a low resistance by the control of the applied magnetic field, thus generating an emitter current with different intensity under a fixed voltage, so that a collector current passing through the single potential energy barrier may also vary with different applied magnetic fields.

Figure 2A:
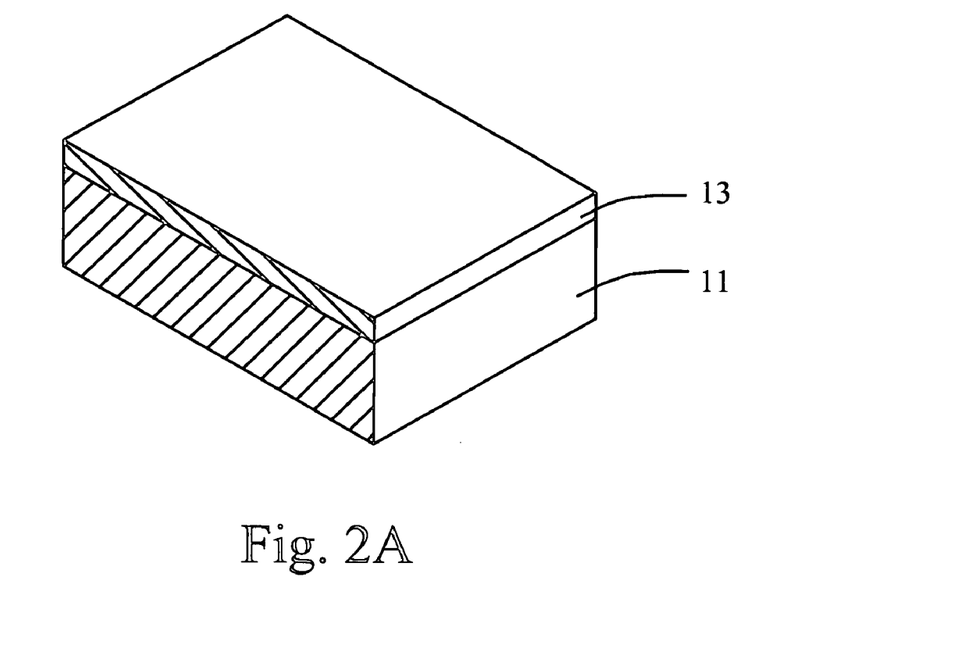
FIGS. 2A to 2E are schematic views of a method of manufacturing the first embodiment of the present invention.
Figure 2B:
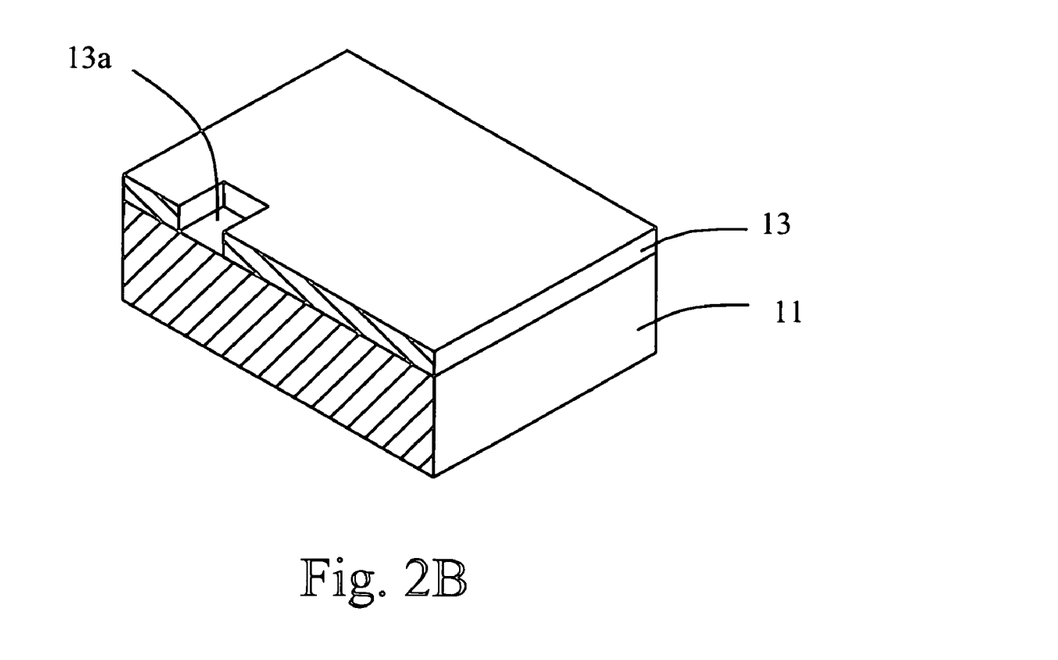
Figure 2C:
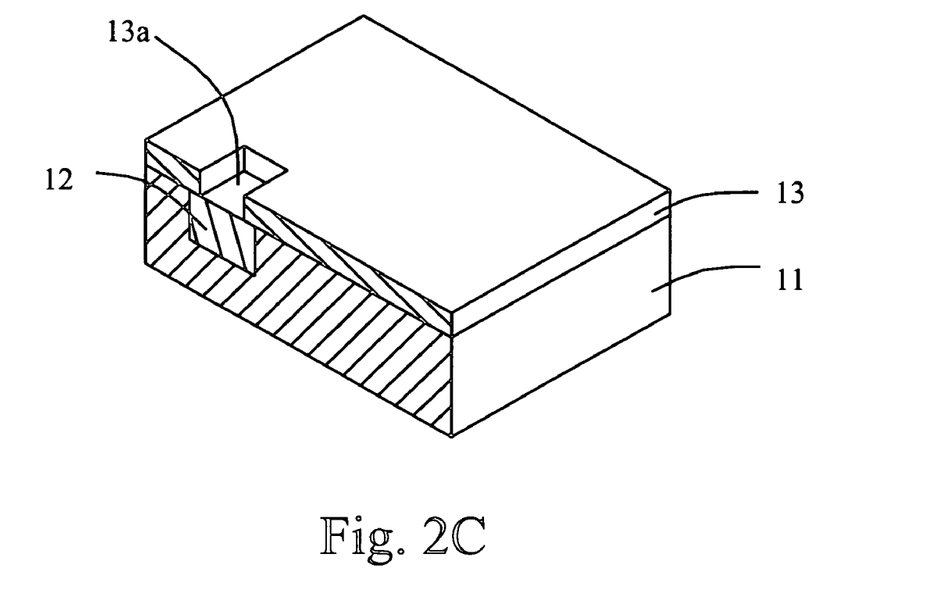
Figure 2D:
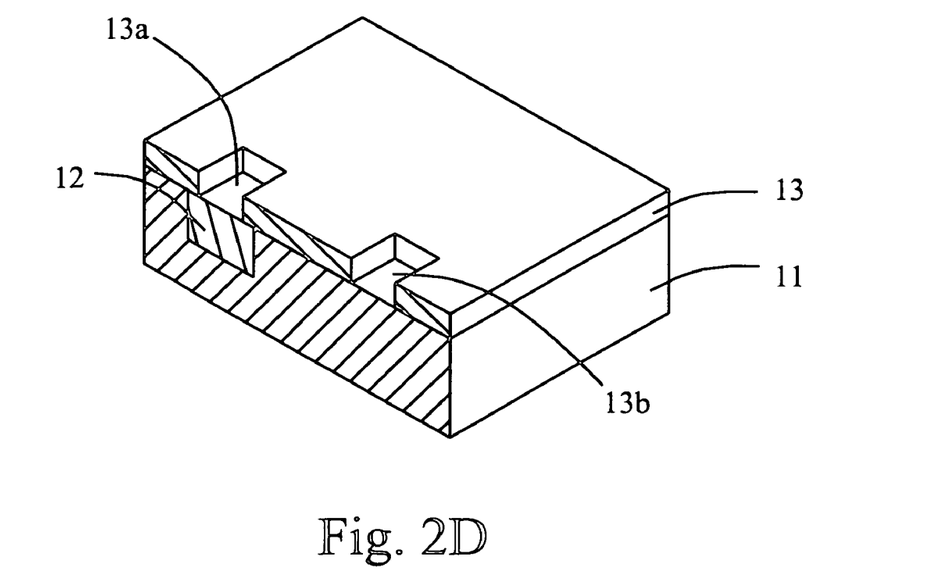
Figure 2E:
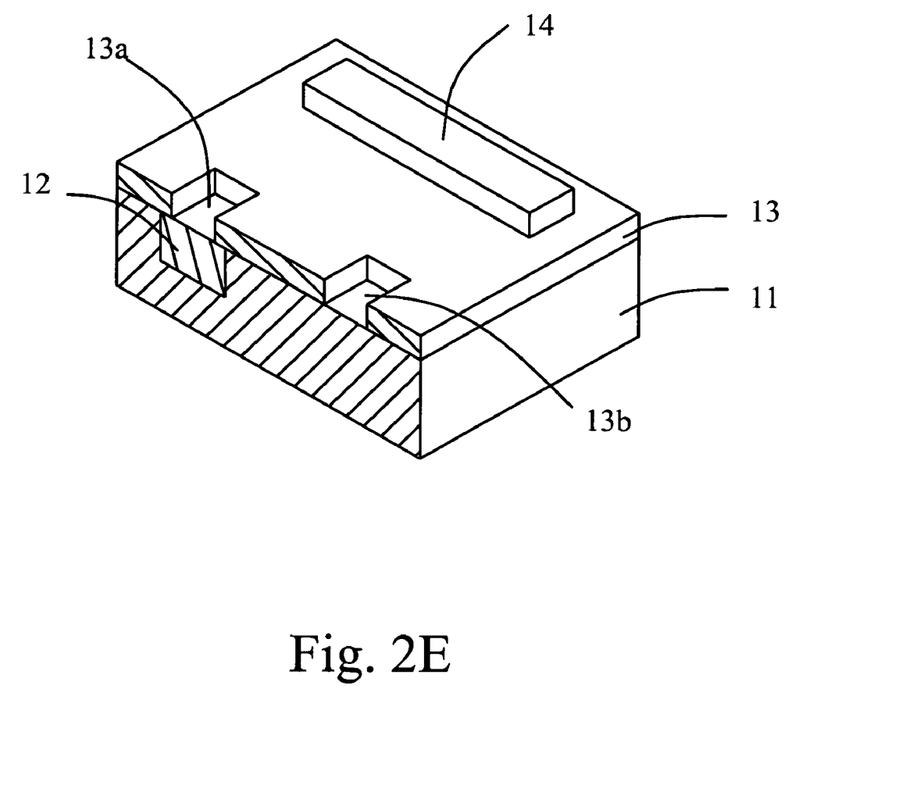

Referring to FIGS. 2A to 2E, the manufacturing method of the first embodiment is illustrated in details. As shown in FIG. 2A, an insulation layer 13 is first formed on the P-type silicon substrate 11. The insulation layer 13 is a silicon dioxide layer formed by the oxidation of the P-type silicon substrate 11. In addition, the insulation layer 13 may also be of another material with insulating effect. As shown in FIG. 2B, a first contact window 13a is formed in the insulation layer 13. The first contact window 13a is formed by lithography and etching processing. This lithography may be yellow light lithography or electron beam lithography. As shown in FIG. 2C, an N-type well region 12 is formed in the P-type silicon substrate 11 via the first contact window 13a. The N-type well region 12 is a doping area formed by implanting N-type ions with high concentration. A PN junction generated by the P-type silicon substrate 11 and the N-type well region 12 may provide a single potential energy barrier. In the same way, an N-type silicon substrate formed with a P-type well region may also be used in the present invention. As shown in FIG. 2D, a second contact window 13b is formed in the insulation layer 13. The second contact window 13b is formed by lithography and etching processing. This lithography may be yellow light lithography or electron beam lithography. As shown in FIG. 2E, a magnetoresistive film 14 is formed on the insulation layer 13. The magnetoresistive film 14 is a magnetic multi-layer film deposited by evaporating or sputtering, which may be formed by bounding on the insulation layer 13 after it is produced. Referring to FIG. 1 again, a first metal region 15 located at the first contact window 13a, a second metal region 16 located at the second contact window 13b and a third metal region 17 located at the magnetoresistive film 14 are formed, wherein the first metal region 15 contacts the magnetoresistive film 14. The first metal region 15, the second metal region 16 and the third metal region 17 are used as the base terminal, the collector terminal, and the emitter terminal of the spin transistor, respectively. The method for forming the first metal region 15, the second metal region 16, and the third metal region 17 is: first depositing a metal conductive material on a surface as shown in FIG. 2E; then defining the patterns of the first metal region 15, the second metal region 16, and the third metal region 17 by lithography and etching processing. The first metal region 15 contacts the N-type well region 12 and the magnetoresistive film 14 as a base electrode. The second metal region 16 contacts the P-type silicon substrate 11 as a collector electrode. The third metal region 17 is connected with the magnetoresistive film 14 as an emitter contact. The manufacturing method of the present invention integrates the emitter, the base, and the collector of the spin transistor in the same plane surface, so as to simplify the manufacturing process of the spin transistor. Also, all the manufacturing steps can be achieved by general semiconductor manufacturing processes to improve the convenience of production. When utilizing the electron beam lithography or yellow light lithography to define element patterns, miniaturization of the spin transistor can be achieved. The minimum line width of a pattern defined by electron beam lithography is 0.5 micron.

Figure 3:
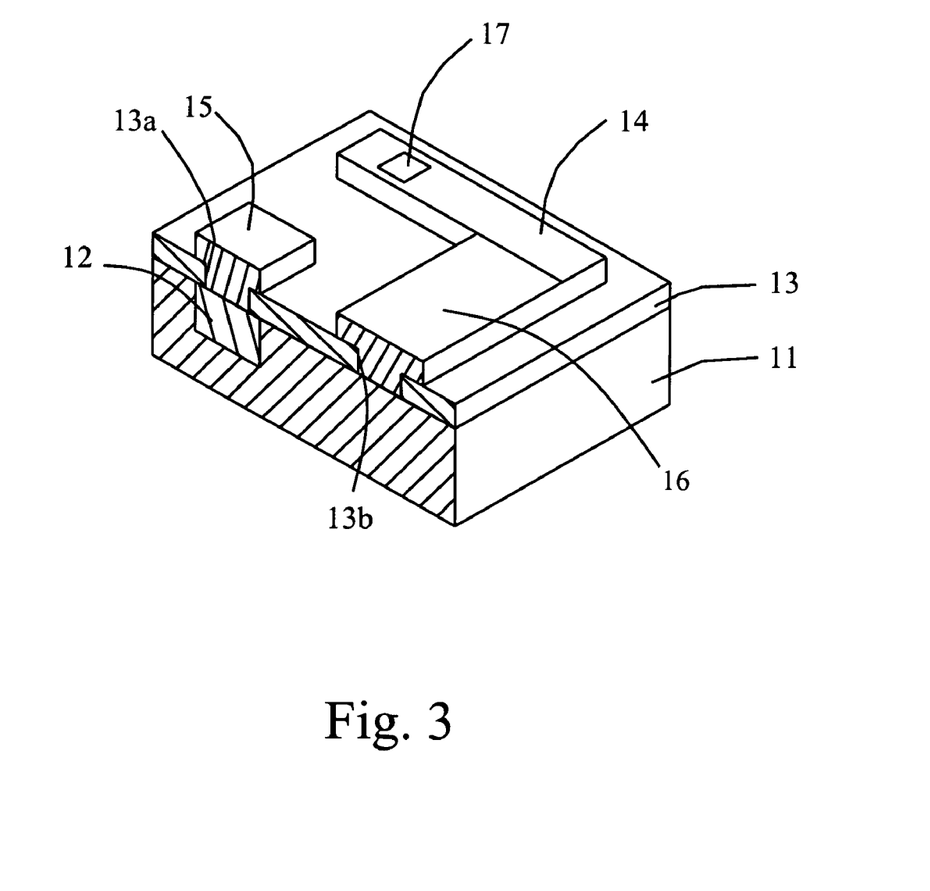
FIG. 3 is a diagram of a second embodiment of the present invention.

In addition, the present invention may be used to produce another kind of spin transistor of the CIP type. Referring to FIG. 3, it shows a second embodiment of the present invention. In the second embodiment, the insulation layer 13 is first formed on the P-type silicon substrate 11 (referring to FIG. 2A). The insulation layer 13 is a silicon dioxide layer formed by oxidation of the P-type silicon substrate 11. In addition, the insulation layer 13 may also be of another material with insulating effect. Then, the first contact window 13a is formed in the insulation layer 13 (referring to FIG. 2B). The first contact window 13a is formed by lithography and etching processing. This lithography may be yellow light lithography or electron beam lithography. Next, the N-type well region 12 is formed in the P-type silicon substrate 11 via the first contact window 13a (referring to FIG. 2C). The N-type well region 12 is a doping area formed by implanting N-type ions with high concentration. The PN junction generated by the P-type silicon substrate 11 and the N-type well region 12 provides a single potential energy barrier. In the same way, an N-type silicon substrate formed with a P-type well region may also be used in the present invention. Next, the second contact window 13b is formed in the insulation layer 13 (referring to FIG. 2D). The second contact window 13b is formed by lithography and etching processing. This lithography may be yellow light lithography or electron beam lithography. Then, the magnetoresistive film 14 is formed on the insulation layer 13 (referring to FIG. 2E,). The magnetoresistive film 14 is a magnetic multi-layer film deposited by evaporating or sputtering, which may be formed by bounding on the insulation layer 13 after it is produced. Finally, as shown in FIG. 3, a first metal region 15 located at the first contact window 13a, a second metal region 16 located at the second contact window 13b and a third metal region 17 located at the magnetoresistive film 14 are formed, wherein the second metal region 16 contacts the magnetoresistive film 14. The first metal region 15, the second metal region 16 and the third metal region 17 are used as the collector terminal, the base terminal, and the emitter terminal of the spin transistor, respectively. The method for forming the first metal region 15, the second metal region 16, and the third metal region 17 is first to deposit a metal conductive material on a surface as shown in FIG. 2E. Then, the patterns of the first metal region 15, the second metal region 16, and the third metal region 17 are respectively defined by lithography and etching processing. The first metal region 15 contacts the N-type well region 12 as a collector electrode. The second metal region 16 contacts the P-type silicon substrate 11 and the magnetoresistive film 14 as a base electrode. The third metal region 17 is connected with the magnetoresistive film 14 as an emitter contact.

The structure of the CIP type spin transistor in the second embodiment is illustrated as follows. Referring to FIG. 3, the P-type silicon substrate 11 has an insulation layer 13 on its surface, and the insulation layer 13 has a first contact window 13a and a second contact window 13b. An N-type well region 12 is formed in the P-type silicon substrate 11 by ion-implantation and located below the first contact window 13a. A first metal region 15 is located at the first contact window 13a. A second metal region 16 is located at the second contact window 13b. A magnetoresistive film 14 is located on the insulation layer 13, and contacts the second metal region 16. A third metal region 17 is located on the magnetoresistive film 14. The first metal region 15, the second metal region 16 and the third metal region 17 are used as the collector terminal, the base terminal, and the emitter terminal of the spin transistor, respectively.

Figure 4A:
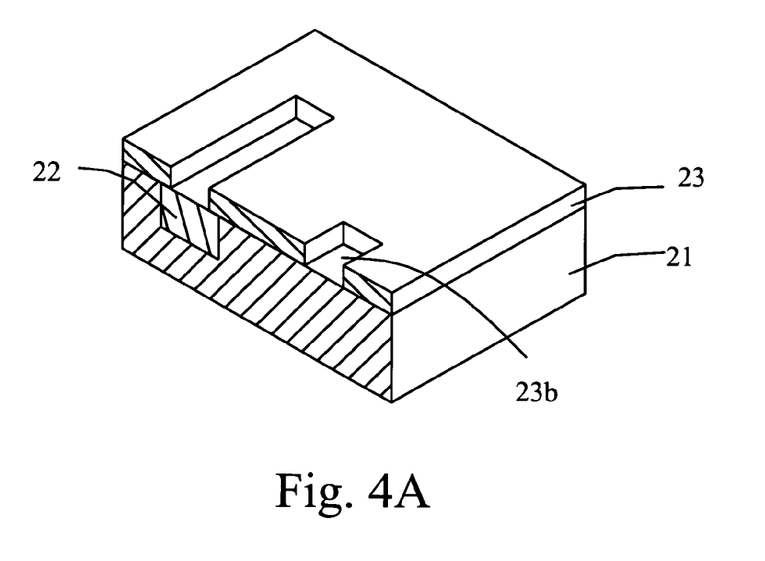
FIGS. 4A to 4C are diagrams of a third embodiment of the present invention.
Figure 4B:
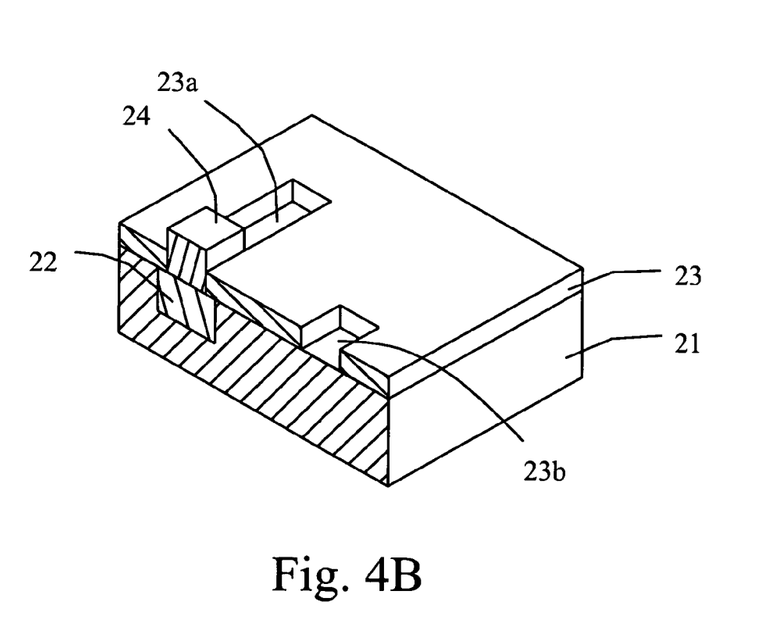
Figure 4C:
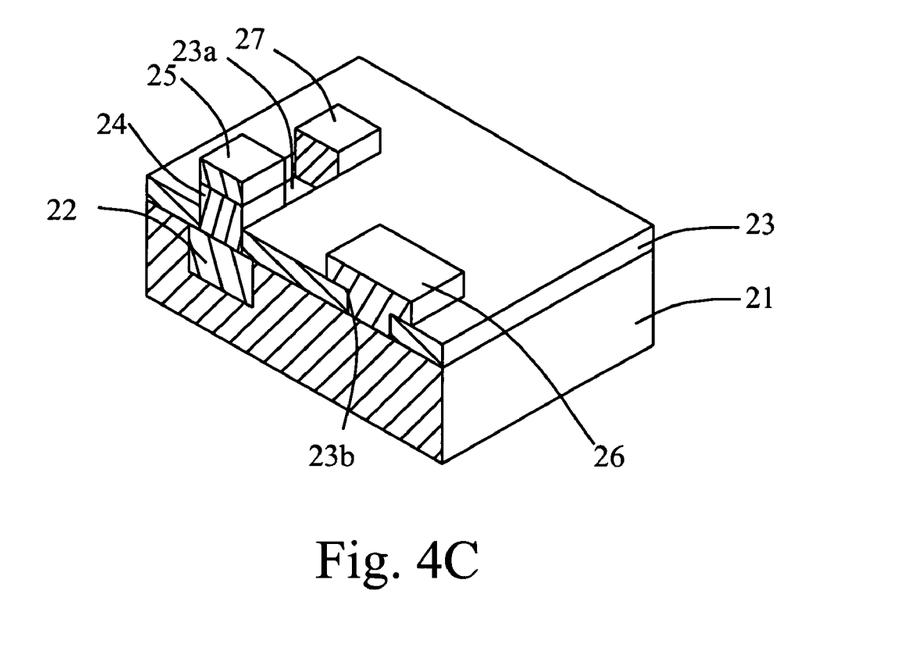

In addition, the manufacturing method of the present invention may also be used to produce a Current Perpendicular Plane (CPP for short) type spin transistor. Referring to FIGS. 4A to 4C, these drawings show a third embodiment of the present invention. As shown in FIG. 4A, the manufacturing method of the present invention is first to form an insulation layer 23 on a P-type silicon substrate 21. Then, a first contact window 23a is formed in the insulation layer 23, and an N-type well region 22 is formed in the P-type silicon substrate 21 via the first contact window 23a, wherein the size of the first contact window 23a may be adjusted according to the subsequent manufacture steps. Next, a second contact window 23b is formed in the insulation layer 23 (the manufacturing method of the aforementioned steps is the same as the manufacturing method in FIGS. 2A to 2D, which will not be repeated here). Next, as shown in FIG. 4B, a magnetoresistive film 24 is formed at a first position of the first contact window 23a. The magnetoresistive film 24 is deposited directly on the first contact window 23a by evaporating or sputtering, and the pattern of the magnetoresistive film 24 is defined by lithography and etching processing. Finally, as shown in FIG. 4C, a first metal region 25, a second metal region 26, and a third metal region 27 are formed, wherein the first metal region 25 is located on the magnetoresistive film 24, the second metal region 26 is located at the second contact window 23b, and the third metal region 27 is located at a second position of the first contact window 23a. The third metal region 27 and the magnetoresistive film 24 are not contacted with each other. The first metal region 25, the second metal region 26, and the third metal region 27 are used as the emitter terminal, the collector terminal, and the base terminal of the spin transistor, respectively. The method for forming the first metal region 25, the second metal region 26, and the third metal region 27 is first to deposit a metal conductive material on the surface as shown in FIG. 4B. Then, the patterns of the first metal region 25, the second metal region 26, and the third metal region 27 are defined by lithography and etching processing. The first metal region 25 is located on the magnetoresistive film 24 as an emitter terminal, the second metal region 26 contacts the P-type silicon substrate 21 as a collector terminal, and the third metal region 27 is located on the P-type silicon substrate 21 as a base contact.

Figure 5A:
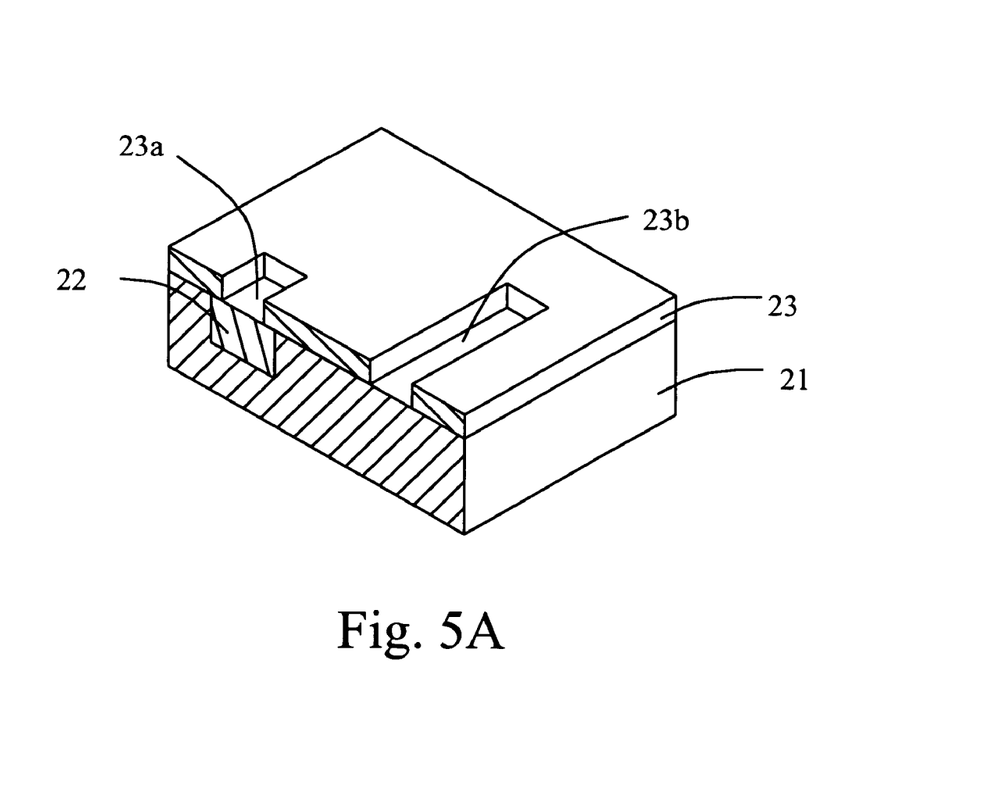
FIGS. 5A to 5C are diagrams of a fourth embodiment of the present invention.
Figure 5B:
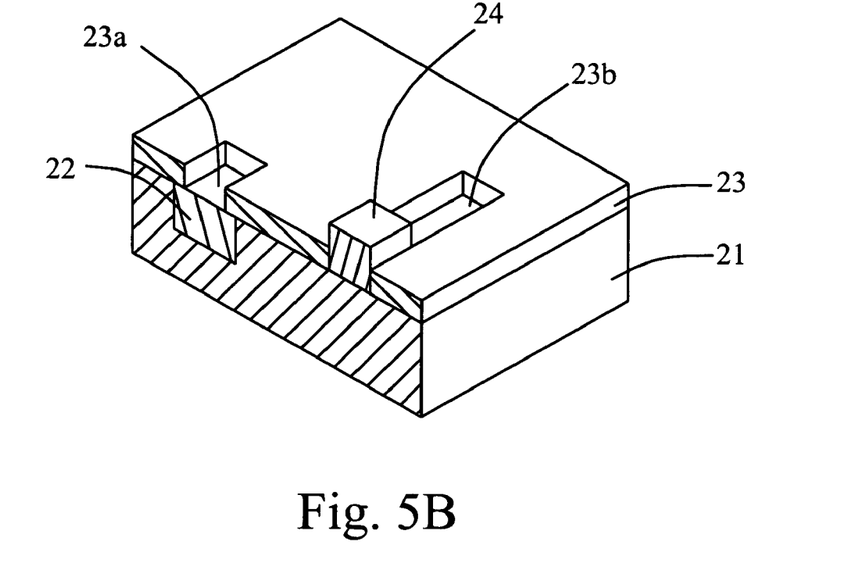
Figure 5C:
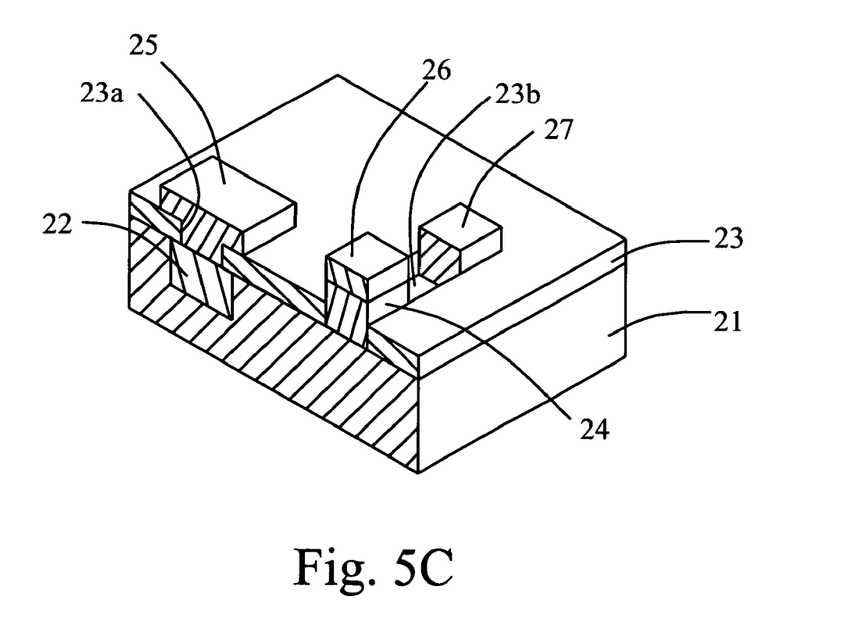

In addition, the manufacturing method of the present invention may also produce another kind of spin transistor of a CPP-type. Referring to FIGS. 5A to 5C, these drawings show a fourth embodiment of the present invention. As shown in FIG. 5A, the manufacturing method of the present invention is first to form an insulation layer 23 on the P-type silicon substrate 21. Then, a first contact window 23a is formed in the insulation layer 23, and a N-type well region 22 is formed in the P-type silicon substrate 21 via the first contact window 23a. Next, a second contact window 23b is formed in the insulation layer 23, wherein the size of the second contact window 23b may be adjusted according to the subsequent manufacture steps (the manufacturing method of the aforementioned steps is the same as the manufacturing method in FIGS. 2A to 2D, which will not be repeated here). Next, as shown in FIG. 5B, a magnetoresistive film 24 is formed at a first position of the second contact window 23b. The magnetoresistive film 24 is deposited directly on the second contact window 23b by evaporating or sputtering, and the pattern of the magnetoresistive film 24 is defined by lithography and etching processing. Finally, as shown in FIG. 5C, a first metal region 25, a second metal region 26, and a third metal region 27 are formed, wherein the first metal region 25 is located at the first contact window 23a, the second metal region 26 is located on the magnetoresistive film 24, and the third metal region 27 is located at a second position of the second contact window 23b. The third metal region 27 and the magnetoresistive film 24 are not contacted with each other. The first metal region 25, the second metal region 26, and the third metal region 27 are used as the collector terminal, the emitter terminal and the base terminal of the spin transistor. The method for forming the first metal region 25, the second metal region 26, and the third metal region 27 is first to deposit a metal conductive material on the surface as shown in FIG. 5B. Then, the patterns of the first metal region 25, the second metal region 26, and the third metal region 27 are defined by lithography and etching processing. The first metal region 25 contacts the N-type well region 22 as a collector terminal, the second metal region 26 is located on magnetoresistive film 24 as an emitter terminal, and the third metal region 27 is located on the P-type silicon substrate 21 as a base contact.

In summary, the present invention may be used to produce a spin transistor with the emitter, the base, and the collector in the same plane surface, which is advantageous for the integration and subsequent packaging of the spin transistor and integrated circuit elements. The present invention not only simplifies the manufacturing process of the spin transistor, but all the steps can be achieved by general semiconductor manufacturing processes to improve the convenience of production. The spin transistors with the structure of the present invention can achieve the object of miniaturization by utilizing the electron beam lithography or yellow light lithography to define element patterns.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a spin transistor, comprising:
    forming an insulation layer on a substrate;
    forming a first contact window in the insulation layer;
    forming a doping area in the substrate via the first contact window, wherein the conductivity of the doping area is opposite to that of the substrate;
    forming a second contact window in the insulation layer;
    forming a magnetoresistive film on the insulation layer;
    forming a metal conductive layer on the insulation layer, the first contact window, the second contact window and the magnetoresistive film; and
    performing a lithography and etching processing on the metal conductive layer to define a first metal region located at the first contact window, a second metal region located at the second contact window, and a third metal region located on the magnetoresistive film, wherein the first metal region contacts the magnetoresistive film.

2. The method of manufacturing a spin transistor as claimed in claim 1, wherein the substrate is a P-type silicon substrate.

3. The method of manufacturing a spin transistor as claimed in claim 1, wherein the doping area is an N-type well region.

4. The method of manufacturing a spin transistor as claimed in claim 1, wherein the magnetoresistive film is formed by bounding on the insulation layer.

5. The method of manufacturing a spin transistor as claimed in claim 1, wherein the first metal region, the second metal region, and the third metal region are located in a same plane surface.

6. The method of manufacturing a spin transistor as claimed in claim 5, wherein the first metal region contacts the doping area.

7. The method of manufacturing a spin transistor as claimed in claim 6, wherein the second metal region contacts the substrate.

8. The method of manufacturing a spin transistor as claimed in claim 7, wherein the third metal region contacts the magnetoresistive film.

9. A method of manufacturing a spin transistor, comprising::
   forming an insulation layer on a substrate;
   forming a first contact window in the insulation layer;
   forming a doping area in the substrate via the first contact window, the conductivity of the doping area being opposite to a conductivity of the substrate;
   forming a second contact window in the insulation layer;
   forming a magnetoresistive film in direct contact with an upper surface of the insulation layer;
   forming a first metal region located at the first contact window, a second metal region located at the second contact window, and a third metal region located on the magnetoresistive film, the first metal region being in direct contact with the upper surface of the insulation layer and contacting the magnetoresistive film;
   forming a metal conductive layer on the insulation layer, the first contact window, the second contact window and the magnetoresistive film; and
   performing a lithography and etching processing on the metal conductive layer to form the first, second and third metal regions.

10. The method of manufacturing a spin transistor as claimed in claim 9, wherein the substrate is a P-type silicon substrate.

11. The method of manufacturing a spin transistor as claimed in claim 9, wherein the doping area is an N-type well region.

12. The method of manufacturing a spin transistor as claimed in claim 9, wherein the magnetoresistive film is formed by bounding on the insulation layer.

13. The method of manufacturing a spin transistor as claimed in claim 9, wherein the first metal region, the second metal region, and the third metal region are located in a same plane surface.

14. The method of manufacturing a spin transistor as claimed in claim 13, wherein the first metal region also contacts the doping area.

15. The method of manufacturing a spin transistor as claimed in claim 14, wherein the second metal region contacts the substrate.

16. The method of manufacturing a spin transistor as claimed in claim 15, wherein the third metal region contacts the magnetoresistive film.

* * * * *